(12) United States Patent
Fu

(10) Patent No.: US 11,127,768 B2
(45) Date of Patent: Sep. 21, 2021

(54) ARRAY SUBSTRATE, DISPLAY PANEL, DISPLAY DEVICE AND METHOD FOR MANUFACTURING ARRAY SUBSTRATE

(71) Applicant: Shanghai Tianma Micro-Electronics Co., Ltd., Shanghai (CN)

(72) Inventor: Jujian Fu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 52 days.

(21) Appl. No.: 16/734,771

(22) Filed: Jan. 6, 2020

(65) Prior Publication Data

US 2021/0098509 A1  Apr. 1, 2021

(30) Foreign Application Priority Data

Sep. 27, 2019 (CN) .......................... 201910924553.9

(51) Int. Cl.
*H01L 27/14* (2006.01)
*H01L 27/12* (2006.01)

(52) U.S. Cl.
CPC ........ *H01L 27/1251* (2013.01); *H01L 27/124* (2013.01); *H01L 27/127* (2013.01); *H01L 27/1225* (2013.01); *H01L 27/1255* (2013.01)

(58) Field of Classification Search
CPC ............. H01L 27/1225; H01L 27/1255; H01L 27/124; H01L 27/127; H01L 27/1251
USPC ................................................ 257/43, 59, 72
See application file for complete search history.

(56) References Cited

U.S. PATENT DOCUMENTS

2018/0248045 A1\* 8/2018 Lim ........................ H01L 29/04
2019/0204668 A1\* 7/2019 Yang ..................... G09G 3/3258

\* cited by examiner

*Primary Examiner* — Tan N Tran
(74) *Attorney, Agent, or Firm* — Miller, Matthias & Hull LLP

(57) ABSTRACT

Provided are an array substrate, a display panel, a display device and a method for manufacturing the array substrate. The array substrate includes a first thin film transistor and a second thin film transistor. The first thin film transistor includes a first active layer, a first gate, a first A-type electrode and a first B-type electrode. The second thin film transistor includes a second active layer, a second gate, a second A-type electrode and a second B-type electrode. In a direction perpendicular to a plane where a substrate is located, a film where the first active layer is located, a film where the first A-type electrode is located, a film where the first B-type electrode is located, and a film where the first gate electrode is located each are disposed between a film where the second active layer is located and the substrate.

15 Claims, 9 Drawing Sheets

ARRAY SUBSTRATE, DISPLAY PANEL, DISPLAY DEVICE AND METHOD FOR MANUFACTURING ARRAY SUBSTRATE

CROSS-REFERENCES TO RELATED APPLICATIONS

This application claims the priority to a Chinese patent application No. CN201910924553.9 filed at the CNIPA on Sep. 30, 2019, disclosure of which is incorporated herein by reference in its entirety.

TECHNICAL FIELD

Embodiments of the present disclosure relate to display technologies and, in particular, to an array substrate, a display panel, a display device and a method for manufacturing the array substrate.

BACKGROUND

A low temperature polycrystalline oxide (LTPO) technology is a technology for manufacturing both a low temperature polysilicon thin film transistor and an oxide semiconductor thin film transistor on a same backplate. The low temperature polysilicon thin film transistor has advantages of a high switching speed and small power consumption. The oxide semiconductor thin film transistor has advantages of high carrier mobility, low deposition temperature and high transparency. The LTPO technology may fully take advantages of the low temperature polysilicon thin film transistor and the oxide semiconductor thin film transistor, ensuring good display performance of a display device.

However, optimal performance of the LTPO technology is difficult to achieve since the current preparation process may damage an oxide semiconductor active layer of the oxide semiconductor thin film transistor.

SUMMARY

The present disclosure provides an array substrate, a display panel, a display device and a method for manufacturing the array substrate, to solve the problem in the related art that an oxide semiconductor active layer of an oxide semiconductor thin film transistor is damaged in a manufacturing process for a low temperature polysilicon thin film transistor and the oxide semiconductor thin film transistor.

In a first aspect, an embodiment of the present disclosure provides an array substrate, which includes a substrate and a first thin film transistor and a second thin film transistor formed on the substrate.

The first thin film transistor includes a first active layer, a first gate, a first A-type electrode and a first B-type electrode, where the first active layer includes a low temperature polysilicon active layer, The second thin film transistor includes a second active layer, a second gate, a second A-type electrode and a second B-type electrode, where the second active layer includes an oxide semiconductor active layer.

In a direction perpendicular to a plane where the substrate is located, a film here the first active layer is located, a film where the first A-type electrode is located, a film where the first B-type electrode is located, and a film where the first gate is located each are disposed between a film where the second active layer is located and the substrate.

The second A-type electrode and the first gate are disposed in a same film, and the first B-type electrode is reused as the second B-type electrode. In the direction perpendicular to the plane where the substrate is located, a film where the second gate is located is disposed on a side of the film where the second active layer is located facing away from the substrate.

In a second aspect, an embodiment of the present disclosure further provides a display panel including the array substrate according to any embodiment of the present disclosure.

In a third aspect, an embodiment of the present disclosure further provides a display device including the display panel according to any embodiment of the present disclosure.

In a fourth aspect, an embodiment of the present disclosure further provides a method for manufacturing an array substrate. The method includes steps described below.

A substrate is provided.

A first thin film transistor and a second thin film transistor are formed on the substrate. The first thin film transistor includes a first active layer, a first gate, a first A-type electrode and a first B-type electrode, where the first active layer includes a low temperature polysilicon active layer. The second thin film transistor includes a second active layer, a second gate, a second A-type electrode and a second. B-type electrode, where the second active layer includes an oxide semiconductor active layer. In a direction perpendicular to a plane where the substrate is located, a film where the first active layer is located, a film where the first A-type electrode is located, a film where the first B-type electrode is located, and a film where the first gate is located each are located between a film where the second active layer is located and the substrate, The second A-type electrode and the first gate are disposed in a same film, and the first B-type electrode is reused as the second B-type electrode. In the direction perpendicular to the plane where the substrate is located, a film where the second gate is located is disposed on a side of the film where the second active layer is located facing away from the substrate.

According to the embodiments of the present disclosure, in the direction perpendicular to the plane where the substrate is located, the film where the first active layer is located, the film where the first A-type electrode is located, the film where the first B-type electrode is located, and the film where the first gate is located each are disposed between the film where the second active layer is located and the substrate, solving the problem in the related art that the oxide semiconductor active layer of the oxide semiconductor thin film transistor is damaged in the manufacturing process for the low temperature polysilicon thin film transistor and the oxide semiconductor thin film transistor, fully taking the advantages of high carrier mobility, low deposition temperature and high transparency of the oxide semiconductor thin film transistor, and significantly improving a display effect of the display device.

DETAILED DESCRIPTION

Figure 1:
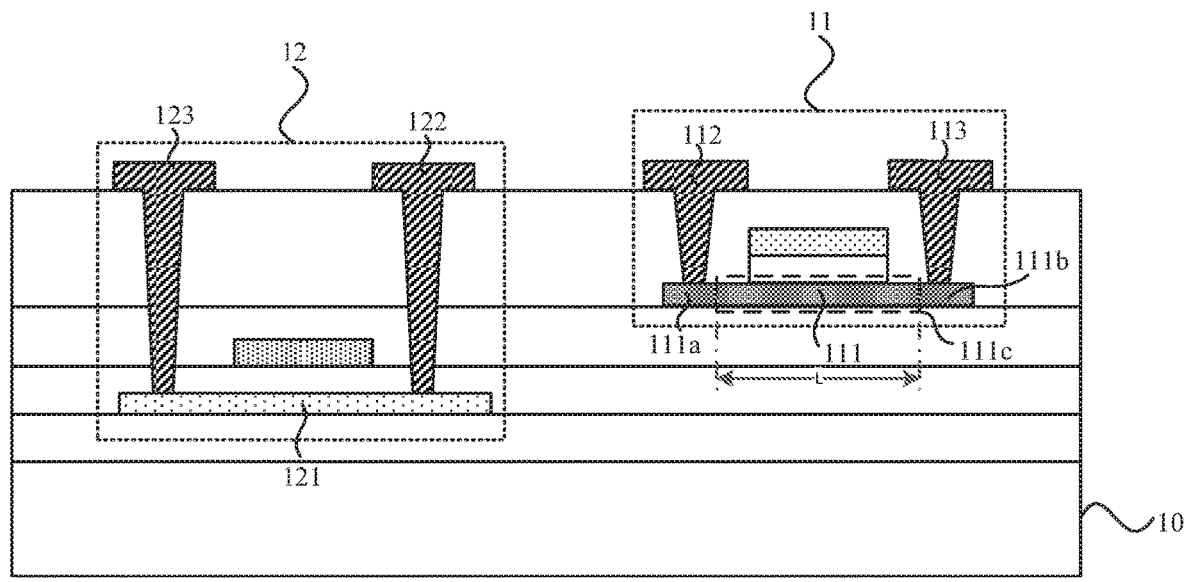
FIG. 1 is a structural diagram of an existing array substrate.

Hereinafter the present disclosure will be further described in detail in conjunction with drawings and embodiments. It is to be understood that the embodiments set forth below are merely intended to illustrate and not to limit the present disclosure. Additionally, it is to be noted that, for ease of description, merely part, not all, of the structures related to the present disclosure are illustrated in the drawings.

FIG. 1 is a structural diagram of an existing array substrate. Referring to FIG. 1, the array substrate includes a substrate 10, an oxide semiconductor thin film transistor 11 and a low temperature polysilicon thin film transistor 12, where the oxide semiconductor thin film transistor 11 and the low temperature polysilicon thin film transistor 12 are disposed on a side of the substrate 10. The oxide semiconductor thin film transistor 11 includes an oxide semiconductor active layer 111, a first source 112 and a first drain 113. The low temperature polysilicon thin film transistor 12 includes a low temperature polysilicon active layer 121, a second source 122 and a second drain 123. The oxide semiconductor active layer 111 is disposed on a side of the first source 112 and the first drain 113 facing towards the substrate 10, the low temperature polysilicon active layer 121 is disposed on a side of the second source 122 and the second drain 123 facing towards the substrate 10, and the first source 112, the first drain 113, the second source 122 and the second drain 123 are arranged at a same layer. The low temperature polysilicon active layer 121 needs to be cleaned by using hydrofluoric acids when the second source 122 and the second drain 123 are prepared, to prevent impurities on a surface of the low temperature polysilicon active layer 121 from affecting an electrical contact effect of the second source 122 and the second drain 123 with the low temperature polysilicon active layer 121. However, the first source 112, the first drain 113, the second source 122 and the second drain 123 are arranged at the same layer, and via holes through which the first source 112, the first drain 113, the second source 122 and the second drain 123 are connected to the active layers are prepared in a preparation process; therefore the oxide semiconductor active layer 111 is damaged by the hydrofluoric acids when the low temperature polysilicon active layer 121 is cleaned by using the hydrofluoric acids, thereby affecting performance of the oxide semiconductor thin film transistor, and further affecting a display effect of the whole display device.

Figure 2:
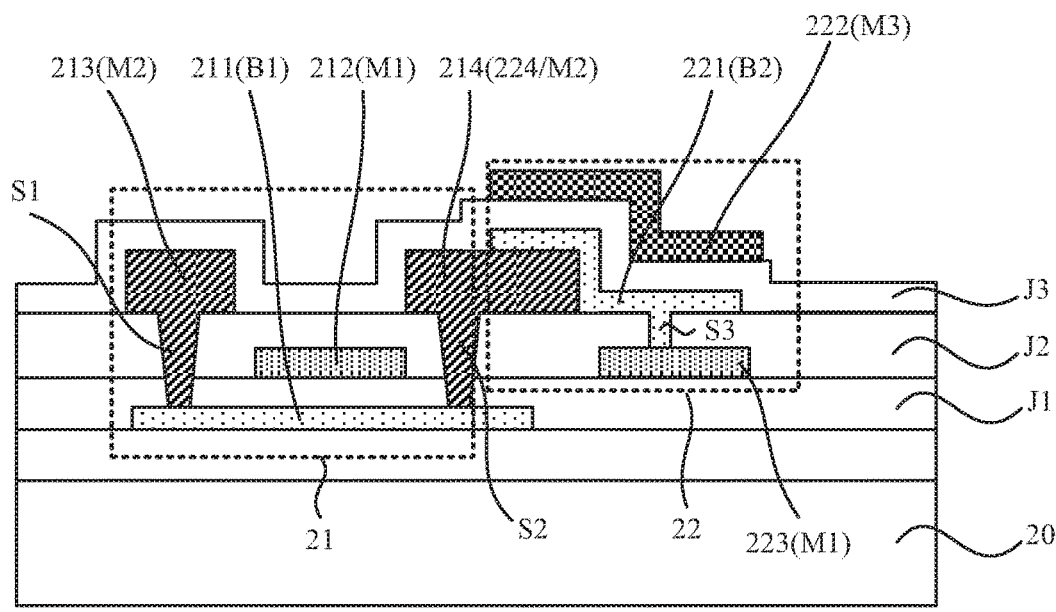
FIG. 2 is a structural diagram of an array substrate according to an embodiment of the present disclosure.

Based on the above-mentioned technical problem, the embodiments of the present disclosure provide an array substrate. FIG. 2 is a structural diagram of an array substrate according to an embodiment of the present disclosure. Referring to FIG. 2, the array substrate includes a substrate 20 and a first thin film transistor 21 and a second thin film transistor 22 formed on the substrate 20, where the first thin film transistor 21 includes a first active layer 211, a first gate 212, a first A-type electrode 213 and a first B-type electrode 214, and the first active layer 211 includes a low temperature polysilicon active layer. The second thin film transistor 22 includes a second active layer 221, a second gate 222, a second A-type electrode 223 and a second B-type electrode 224, and the second active layer 221 includes an oxide semiconductor active layer. In a direction perpendicular to a plane where the substrate 20 is located, a film where the first active layer 211 is located, a film where the first A-type electrode 213 is located, a film where the first B-type electrode 214 is located, and a film where the first gate 212 is located each are disposed between a film where the second active layer 221 is located and the substrate 20, that is to say, the first active layer 211, the first gate 212, the first A-type electrode 213 and the first B-type electrode 214 each are located in films below the second active layer 221. In the preparation process, the first active layer 211 and the first gate 212 are prepared, a first A-type electrode contact region and a first B-type electrode contact region in the first active layer 211 are cleaned using the hydrofluoric acids, the first A-type electrode 213 and the first B-type electrode 214 are formed such that the first A-type electrode 213 is electrically connected to the first A-type electrode contact region and the first B-type electrode 214 is electrically connected to the first B-type electrode contact region, and finally, the second active layer 221 is prepared. In this way, the hydrofluoric acids can be prevented from damaging the second active layer 221, that is, the oxide semiconductor active layer, and the advantages of high carrier mobility, low deposition temperature and high transparency of the second thin film transistor 22 can be fully taken, thereby significantly improving a display effect of a display device.

Optionally, the second A-type electrode 223 and the first gate 212 are disposed in a same film.

Optionally, the first B-type electrode 214 is reused as the second B-type electrode 224.

In the direction perpendicular to the plane where the substrate 20 is located, a film where the second gate 222 is located is disposed on a side of the film where the second active layer 221 is located facing away from the substrate 20.

Optionally, one of the first A-type electrode 213 and the first B-type electrode 214 is a source of the first thin film transistor 21, and the other one of the first A-type electrode 213 and the first B-type electrode 214 is a drain of the first thin film transistor 21. Similarly, one of the second A-type electrode 223 and the second B-type electrode 224 is a source of the second thin film transistor 22, and the other one of the second A-type electrode 223 and the second B-type electrode 224 is a drain of the second thin film transistor 22.

In the above-mentioned technical solution, in the direction perpendicular to the plane where the substrate 20 is located, the film where the first active layer 211 is located, the film where the first A-type electrode 213 is located, the film where the first B-type electrode 214 is located, and the film where the first gate 212 is located each are disposed between the film where the second active layer 221 is located and the substrate 20. In essence, parts (including the first active layer 211, the first gate 212, the first A-type electrode 213 and the first B-type electrode 214) of a low temperature polysilicon thin film transistor (that is, the first thin film transistor 21) are manufactured firstly. After the entire low temperature polysilicon thin film transistor (that is, the first thin film transistor 21) is manufactured, the second active layer 221 of the oxide semiconductor thin film transistor (that is, the second thin film transistor 22) is manufactured. In this way, when the hydrofluoric acids are used to clean the low temperature polysilicon active layer, since the second active layer 221 has not formed, the hydrofluoric acids can be prevented from damaging the second active layer 221, that is, the oxide semiconductor active layer, and the advantages of the high carrier mobility, the low deposition temperature and the high transparency of the second thin film transistor 22 are fully taken, thereby significantly improving the display effect of the display device.

In addition, in the above-mentioned technical solution, the second A-type electrode 223 and the first gate 212 are disposed in the same film. In the preparation process, the second A-type electrode 223 and the first gate 212 may be formed in a same manufacturing process by using a same mask plate, and it is unnecessary to prepare mask plates for the second A-type electrode 223 and the first gate 212 separately, saving a cost, reducing the number of manufacturing processes, and improving production efficiency.

Similarly, since the first B-type electrode 214 is reused as the second B-type electrode 224, in the preparation process, the first B-type electrode 214 and the second B-type electrode 224 may be formed in a same manufacturing process by using a same mask plate, and it is unnecessary to prepare mask plates for the first B-type electrode 214 and the second B-type electrode 224 separately, saving the cost, reducing the number of manufacturing processes, and improving the production efficiency.

In addition, a source contact region and a drain contact region on two sides of a channel region of the active layer of the second thin film transistor 22 are connected to the source and the drain of the second thin film transistor 22 respectively. In this embodiment, the source and the drain of the second thin film transistor 22 reuse existing conductive layers separately (that is, the second A-type electrode 223 reuses a conductive layer used for manufacturing the first gate 212, and the second B-type electrode 224 reuses a conductive layer used for manufacturing the first B-type electrode 214), and the source and the drain reuse films of different levels separately, Therefore, on one hand, a step difference is generated between the source and the drain, the step difference is generated between the source contact region and the drain contact region on two sides of the channel region, so that at least a portion of the channel region extends along a direction that intersects with the plane where the substrate 20 is located at the position of the step difference, to reduce a size of a portion of the channel region extending along a lateral direction (that is, a direction parallel to the substrate 20), and further reduce a length of the channel region, thereby increasing a width-to-length ratio of the channel region, improving the carrier mobility; and then improving the performance of the second thin film transistor 22. On the other hand, since the source and the drain are disposed in different films and reuse the existing conductive layers, the source and the drain can be prevented from being too close to cause problems, and space occupied by the thin film transistor can be reduced.

Optionally, the substrate 20 provided by the embodiments of the present disclosure may be a flexible substrate or a rigid substrate, which is not limited in the embodiments of the present disclosure.

It is to be noted that the embodiments of the present disclosure do not define whether the first thin film transistor 21 or the second thin film transistor 22 is a P-type thin film transistor or an N-type thin film transistor. Specifically, when the first thin film transistor 21 is the N-type thin film transistor, the first A-type electrode 213 is the drain of the first thin film transistor 21 and the first B-type electrode 214 is the source of the first thin film transistor 21; when the first thin film transistor is the P-type thin film transistor, the first A-type electrode 213 is the source of the first thin film transistor 21 and the first B-type electrode 214 is the drain of the first thin film transistor 21. Similarly, when the second thin film transistor 22 is the N-type thin film transistor, the second A-type electrode 223 is the drain of the second thin film transistor 22 and the second B-type electrode 224 is the source of the second thin film transistor 22; when the second thin film transistor 22 is the P-type thin film transistor, the second A-type electrode 223 is the source of the second thin film transistor 22 and the second B-type electrode 224 is the drain of the second thin film transistor 22.

The array substrate provided in the above-mentioned technical solution may be applied to a liquid crystal display panel, or may be applied to an organic light-emitting display panel, which is not limited in the present application.

The liquid crystal display panel includes the array substrate, a color filter substrate and a liquid crystal layer disposed between the array substrate and the color filter substrate. In general, the array substrate is integrated with a number of data lines and a number of scanning lines, where the data lines and the scanning lines vertically intersect to form a number of unit regions defined as pixel units. Each pixel unit mainly includes a pixel electrode, a common electrode, a thin film transistor (TFT) and other components. A driving signal is provided to the scanning lines by a driving circuit, and a working state of the thin film transistor may be controlled, so that a driving signal provided by the data lines is duly written into the pixel electrode to control liquid crystal molecules in the liquid crystal layer to deflect. In addition, the color filter substrate is integrated with a black matrix, a color filter film and the like. The black matrix is used for blocking light transmitted from a non-pixel electrode region of the array substrate. The color filter film corresponds to a pixel region of the array substrate. A common electrode layer, the pixel electrode and the liquid crystal layer form a liquid crystal capacitor. If the array substrate provided in the above-mentioned technical solution is applied to the liquid crystal display panel, optionally, the first thin film transistor 21 and the second thin film transistor 22 may be specifically applied to the driving circuit.

The organic light-emitting display panel includes a substrate, a driving circuit layer and an organic light-emitting layer which are sequentially stacked. The driving circuit layer includes a plurality of driving circuits, and the organic light-emitting layer includes a plurality of organic light-emitting units. Each organic light-emitting unit may include an anode, a pixel definition layer, an organic light-emitting layer and a cathode layer. The pixel definition layer includes opening of the pixel definition layer which are in one-to-one correspondence with anodes and exposes bodies of the anodes. The driving circuit is electrically connected to the anode of a corresponding organic light-emitting unit. The organic light-emitting display panel may further include an encapsulation layer (not shown in the figure) disposed on a side of the organic light-emitting units facing away from the substrate and configured to provide water and oxygen protection for the organic light-emitting units. If the array substrate provided in the above-mentioned technical solution is applied to the organic light-emitting display panel, optionally, the first thin film transistor 21 and the second thin film transistor 22 are thin film transistors constituting the driving circuit.

Figure 3:
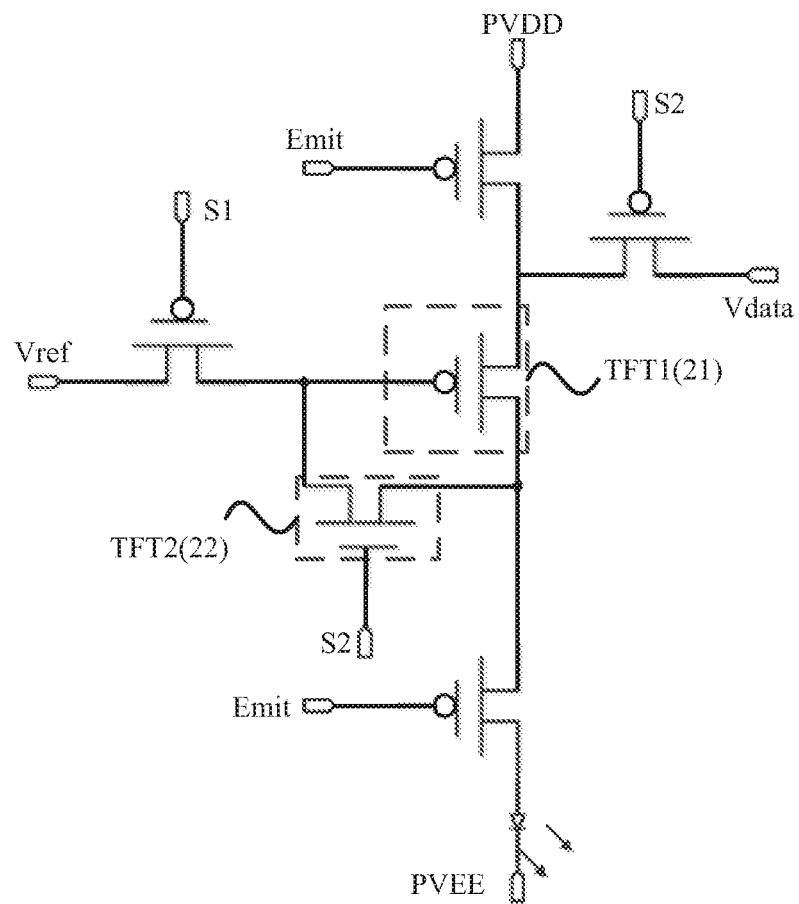
FIG. 3 is a structural diagram of a driving circuit in an organic light-emitting display panel according to an embodiment of the present disclosure.

FIG. 3 is a structural diagram of a driving circuit in an organic light-emitting display panel according to an embodiment of the present disclosure. Referring to FIG. 3, the driving circuit includes a plurality of thin film transistors. Optionally, a thin film transistor TFT1 is the first thin film transistor 21 provided in the above-mentioned technical solution of the present application, and a thin film transistor TFT2 is the second thin film transistor 22 provided in the above-mentioned technical solution of the present application.

Still referring to FIG. 1, the array substrate in the related art has a risk of damaging the oxide semiconductor active layer; in addition, the first source 112 and the first drain 113 both need to be connected to the oxide semiconductor active layer 111 through punched holes, and the second source 122 and the second drain 123 both need to be connected to the low temperature polysilicon active layer 121 through punched holes. Referring to FIG. 3, a gate of the low temperature polysilicon thin film transistor TFT1 further needs to be electrically connected to a source (or a drain) of the oxide semiconductor thin film transistor TFT2. Still referring to FIG. 1, since the gate of the low temperature polysilicon thin film transistor TFT1 and the source (or the drain) of the oxide semiconductor thin film transistor TFT2 are disposed in different films, the gate of the low temperature polysilicon thin film transistor TFT1 needs to be electrically connected to the source (or the drain) of the oxide semiconductor thin film transistor TFT2 through a punched hole, and therefore, the array substrate in the related art needs to be punched multiple times (five holes are illustrated exemplarily). Due to a process limitation, via holes need to occupy a certain area, and more punched holes occupy a larger space, which is not conducive for the display device to achieve a higher pixel resolution. Meanwhile, a complex punching process will reduce preparation efficiency of the array substrate and increase preparation costs of the array substrate, which is not conducive to batch production.

As for the array substrate in the embodiments of the present disclosure, in the direction perpendicular to the plane where the substrate 20 is located, the film where the first active layer 211 is located, the film where the first A-type electrode 213 is located, the film where the first B-type electrode 214 is located and the film where the first gate 212 is located each are disposed between the film where the second active layer 221 is located and the substrate 20; the second A-type electrode 223 and the first gate 212 are disposed in the same film, and the first B-type electrode 214 is reused as the second B-type electrode 224, which has a potential technical effect of reducing the number of punched holes, and may reduce the space occupied by the punched holes, improve a pixel resolution of the display device and the preparation efficiency of the array substrate, and reduce the preparation costs of the array substrate.

How to reduce the number of punched holes is described below in detail in conjunction with a typical example, which is not intended to limit the present application.

Optionally, still referring to FIG. 2, a first semiconductor layer B1, a first insulating layer J1, a first metal layer M1, a second insulating layer J2, a second metal layer M2, a second semiconductor layer B2, a third insulating layer J3 and a third metal layer M3 are sequentially formed on the substrate 20. Where the first active layer 211 is disposed in the first semiconductor layer B1, and the first gate 212 is disposed in the first metal layer M1; the first A-type electrode 213 and the first B-type electrode 214 are disposed in the second metal layer M2, the first A-type electrode 213 is electrically connected to the first active layer 211 through a first via hole S1, and the first B-type electrode 214 is electrically connected to the first active layer 211 through a second via hole S2. The second active layer 221 is disposed in the second semiconductor layer B2, the second A-type electrode 223 is disposed in the first metal layer M1, and the second A-type electrode 223 is electrically connected to the second active layer 221. A portion of the first B-type electrode 214 is covered by the second active layer 221 and the second active layer 221 is electrically connected to the first B-type electrode covered by the second active layer 214 and directly contacts with the first B-type electrode covered by the second active layer 214, so that the first B-type electrode 214 is reused as the second B-type electrode 224. The second gate 222 is disposed in the third metal layer M3.

In FIG. 2, the portion of the first B-type electrode 214 is covered by the second active layer 214, in other words, in the direction perpendicular to the plane where the substrate 20 is located, the second active layer 221 has an overlapping portion with the first B-type electrode 214. For the overlapping portion, a surface of the second active layer 221 facing towards the substrate 20 is in direct contact with a surface of the first B-type electrode 214 facing away from the substrate 20. A manner that the second active layer 221 and the first B-type electrode 214 are electrically connected in direct contact replaces a manner that the second active layer 221 and the first B-type electrode 214 are electrically connected through a punched hole, thereby reducing the number of punched holes and the space occupied by the punched holes, improving the pixel resolution of the display device and the preparation efficiency of the array substrate, and reducing the preparation costs of the array substrate.

Still referring to FIG. 2, the first gate 212 and the second A-type electrode 223 both are disposed in the first metal layer M1. Optionally, the first metal layer M1 is further configured with a metal connection line (not shown in FIG. 2), and the first gate 212 is electrically connected to the second A-type electrode 223 through the metal connection line. In this way, a manner that the first gate 212 and the second A-type electrode 223 are electrically connected through the metal connection line disposed in a same layer as the first gate 212 and the second A-type electrode 223 replaces a manner that the first gate 212 and the second A-type electrode 223 are electrically connected through a punched hole, thereby reducing the number of punched holes and the space occupied by the punched holes, improving the pixel resolution of the display device and the preparation efficiency of the array substrate, and reducing the preparation costs of the array substrate.

Figure 4:
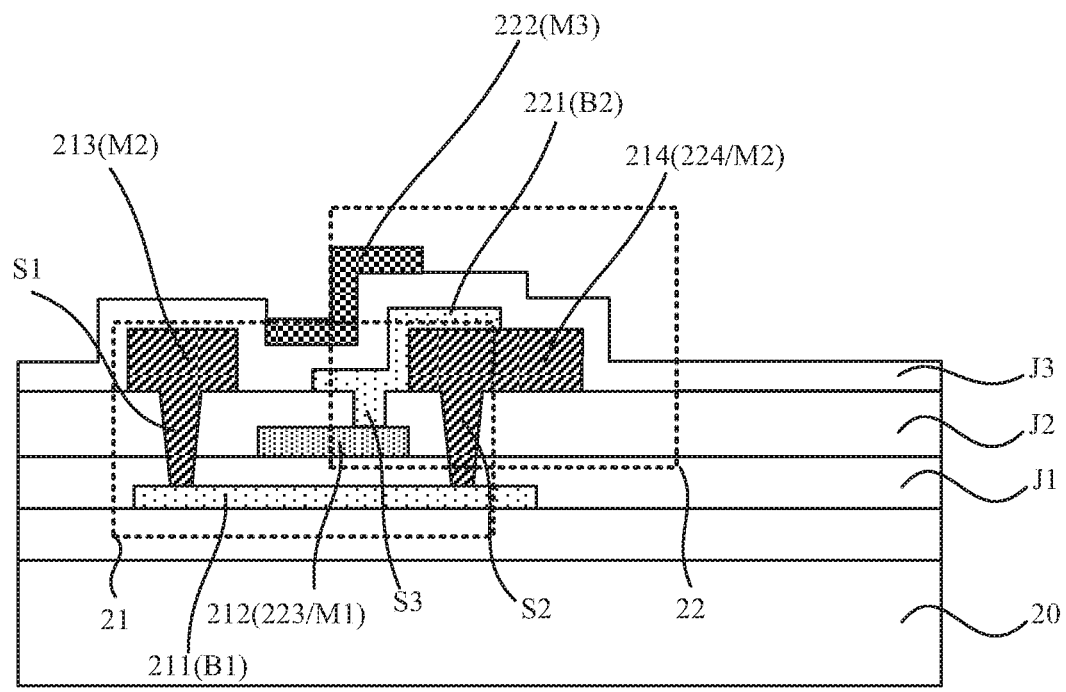
FIG. 4 is a structural diagram of another array substrate according to an embodiment of the present disclosure.

FIG. 4 is a structural diagram of another array substrate according to an embodiment of the present disclosure. In FIG. 4, the first thin film transistor 21 is similarly a top-gate-type thin film transistor. Compared with FIG. 2, FIG. 4 shows a different method for configuring the second A-type electrode 223. Referring to FIG. 4, in the array substrate, the first gate 212 is reused as the second A-type electrode 223. In this way, the first gate 212 can be electrically connected to the second A-type electrode 223 without additionally designing the metal connection line in the first metal layer M1, and the manner that the first gate 212 and the second A-type electrode 223 are electrically connected through the punched hole is replaced, thereby reducing the number of punched holes and the space occupied by the punched holes, improving the pixel resolution of the display device and the preparation efficiency of the array substrate, and reducing the preparation costs of the array substrate. In addition, it is to be understood by those skilled in the art that in practice, when more components (including electrodes, connection traces, etc.) need to be disposed in a same metal layer, a layout design of the metal layer is more difficult, and the preparation costs of the array substrate are greater. The first gate 212 is reused as the second A-type electrode 223, thereby avoiding the metal connection line in the same metal layer, and reducing the difficulty of a layout design of the first metal layer M1 and the preparation costs of the array substrate.

It is to be noted that in FIG. 2 and FIG. 4, since two insulating layers are disposed. between the first.-type electrode 213 and the first active layer 211, which are the first insulating layer J1 and the second insulating layer J2, the first via hole S1 used for enabling the first A-type electrode 213 to be electrically connected to the first active layer 211 penetrates through both the first insulating layer J1 and the second insulating layer J2. Similarly; since two insulating layers are disposed between the first B-type electrode 214 and the first active layer 211, which are the first insulating layer J1 and the second insulating layer J2, the second via hole S2 used for enabling the first A-type electrode 214 to be electrically connected to the first active layer 211 penetrates through both the first insulating layer J1 and the second insulating layer J2.

In FIG. 2 and FIG. 4, the first thin film transistor 21 is the top-gate-type thin film transistor, which is merely a specific example provided by the present application, and is not to limit the present application. Optionally, the first thin film transistor 21 may also be a bottom-gate-type thin film transistor.

Figure 5:
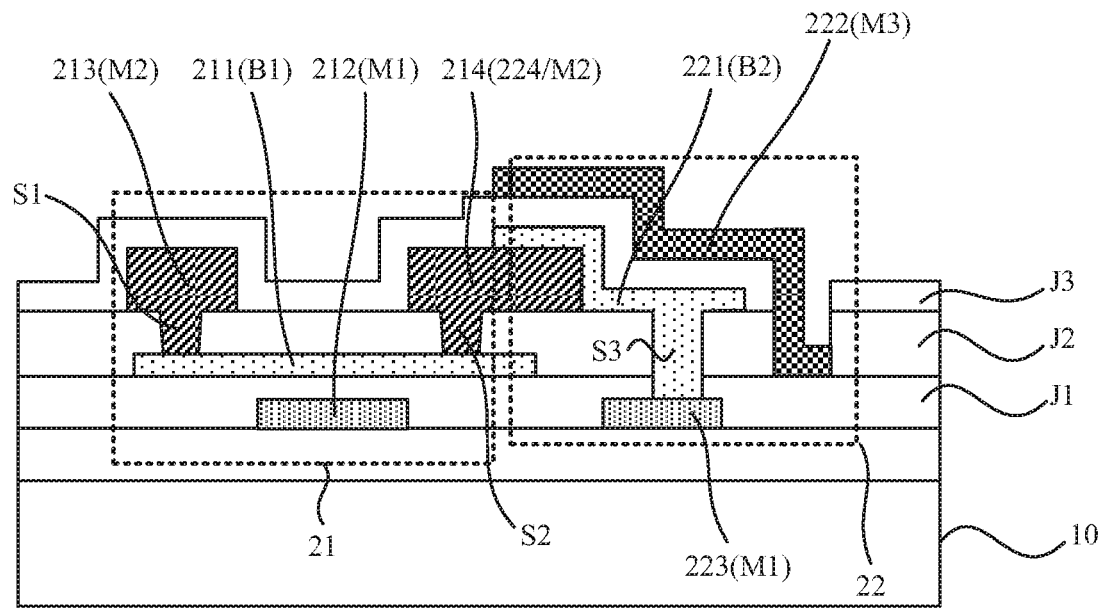
FIG. 5 is a structural diagram of another array substrate according to an embodiment of the present disclosure.

FIG. 5 is a structural diagram of another array substrate according to an embodiment of the present disclosure. In FIG. 5, the first thin film transistor 21 is the bottom-gate-type thin film transistor. Referring to FIG. 5, in this array substrate, the first metal layer M1, the first insulating layer J1, the first semiconductor layer B1, the second insulating layer J2, the second metal layer M2, the second semiconductor layer B2, the third insulating layer J3 and the third metal layer M3 are sequentially formed on the substrate 20. Where the first gate 212 is disposed in the first metal layer M1, the first active layer 211 is disposed in the first semiconductor layer B1, the first A-type electrode 213 and the first B-type electrode 214 are disposed in the second metal layer M2. The first A-type electrode 213 is electrically connected to the first active layer 211 through the first via hole S1, and the first B-type electrode 214 is electrically connected to the first active layer 211 through the second via hole S2. The second active layer 221 is disposed in the second semiconductor layer B2, the second A-type electrode 223 is disposed in the first metal layer M1, and the second A-type electrode 223 is electrically connected to the second active layer 221. A portion of the first B-type electrode 214 is covered by the second active layer 221 and the second active layer 221 is electrically connected to the first B-type electrode 214 covered by the second active layer 221 and directly contacts with the first B-type electrode 214 covered by the second active layer 221, so that the first B-type electrode 214 is reused as the second B-type electrode 224. The second gate 222 is disposed in the third metal layer M3.

In FIG. 5, the portion of first B-type electrode 214 is covered by the second active layer 221, in other words, in the direction perpendicular to the plane where the substrate 20 is located, the second active layer 221 has the overlapping portion with the first B-type electrode 214, where for the overlapping portion, the surface of the second active layer 221 facing towards the substrate 20 is in direct contact with the surface of the first B-type electrode 214 facing away from the substrate 20. The manner that the second active layer 221 and the first B-type electrode 214 are electrically connected in direct contact replaces the manner that the second active layer 221 and the first B-type electrode 214 are electrically connected through the punched hole, thereby reducing the number of the punched holes and the space occupied by the punched holes, improving the pixel resolution of the display device and the preparation efficiency of the array substrate, and reducing the preparation costs of the array substrate.

Still referring to FIG. 5, the first gate 212 and the second A-type electrode 223 both are disposed in the first metal layer M1. Optionally, the first metal layer M1 is further configured with the metal connection line (not shown in FIG. 5), and the first gate 212 is electrically connected to the second A-type electrode 223 through the metal connection line. In this way, the manner that the first gate 212 and the second A-type electrode 223 are electrically connected through the metal connection line disposed in the same layer as the first gate 212 and the second A-type electrode 223 replaces the manner that the first gate 212 and the second A-type electrode 223 are electrically connected through the punched hole, thereby reducing the number of punched holes and the space occupied by the punched holes, improving the pixel resolution of the display device and the preparation efficiency of the array substrate, and reducing the preparation costs of the array substrate.

It is to be noted that in FIG. 5, since merely one insulating layer is disposed between the first A-type electrode 213 and the first active layer 211, that is, the second insulating layer J2, the first via hole S1 used for enabling the first A-type electrode 213 to be electrically connected to the first active layer 211 penetrates through the second insulating layer J2. Similarly, since merely one insulating layer is disposed between the first B-type electrode 214 and the first active layer 211, that is, the second insulating layer J2, the second via hole S2 used for enabling the first B-type electrode 214 to be electrically connected to the first active layer 211 penetrates through the second insulating layer J2.

Figure 6:
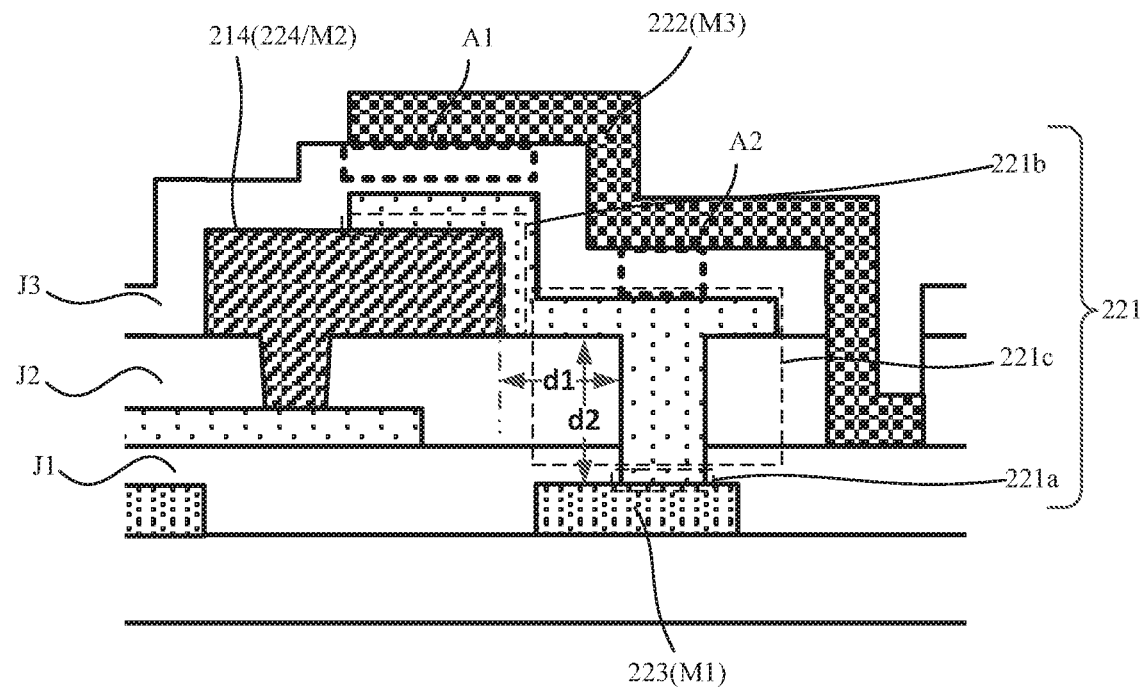
FIG. 6 is an enlarged view of a second thin film transistor shown in FIG. 5.

FIG. 6 is an enlarged view of a second thin film transistor shown in FIG. 5. Optionally, referring to FIG. 6, based on the above-mentioned technical solutions, optionally, the second active layer 221 includes a second A-type electrode contact region 221a, a second B-type electrode contact region 221b and a channel region 221 connecting the second A-type electrode contact region 221a and the second B-type electrode contact region 221b; where the second A-type electrode contact region 221a is electrically connected to the second A-type electrode 223 in direct contact; the second B-type electrode contact region 221b is electrically connected to the second B-type electrode224 in direct contact; a second A-type electrode contact region 221a and the second B-type electrode contact region 221b are located on different planes parallel to the substrate 20, and an extension direction of at least a portion of the channel region 221c intersects with the plane where the substrate 20 is located; and a portion of the third insulating layer J3 covering the second B-type electrode contact region 221b and a portion of the third insulating layer J3 covering the second A-type electrode contact region 221a are located on different planes parallel to the substrate 20.

The second A-type electrode contact region 221a is obtained by processing (for example, ion implantation) a predetermined portion of the second active layer 221 which is in direct contact with the second A-type electrode 223. The second B-type electrode contact region 221b is obtained by processing (for example, ion implantation) a predetermined portion of the second active layer 221 which is on direct contact with the second B-type electrode 224. The channel region 221c is connecting the second A-type electrode contact region 221a and the second B-type electrode contact region 221b. After processing, a carrier concentration of the second A-type electrode contact region 221a and a carrier concentration of the second B-type electrode contact region 221b both are greater than a carrier concentration of the channel region 221c. In practice, a size of the second A-type electrode contact region 221a and a size of the second B-type electrode contact region 221b are not limited in the present application.

Still referring to FIG. 6, the first A-type electrode contact region 221a and the second B-type electrode contact region 221b are located on different planes parallel to the substrate 20, so that a height difference exists between the first A-type electrode contact region 221a and the second B-type electrode contact region 221b; since one end of the channel region 221c is connected to the second A-type electrode contact region 221a, and the other end of the channel region 221c is connected to the second B-type electrode contact region 221b. the channel region 221c will include the portion whose extension direction intersects with the plane where the substrate 20 is located due to the existence of the height difference.

In this field, a length of a channel region of an active layer refers to a path length between a source contact region and a drain contact region of the active layer. For the thin film transistor, assuming that a width of the channel region is a fixed value, a smaller length of the channel region leads to a larger width-to-length ratio of the channel region, higher carrier mobility, and better performance of the thin film transistor. Based on the limitations of the existing process conditions, in order to ensure a normal operation of the thin film transistor, as shown in FIG. 1, if a channel region 111c of the active layer 111 completely extends along a direction parallel to the plane where the substrate 10 is located, a length L (that is, a size of the channel region 111c in a direction parallel to the substrate 10 and from a source contact region 111a to a drain contact region 111b) of the channel region 111c is generally 3-5 μm. Referring to FIG. 6, in this solution, the channel region 221c includes the portion whose extension direction is parallel to the plane where the substrate 20 is located and a portion whose extension direction intersects with the plane where the substrate 20 is located, and a length of the channel region 221c is equal to a sum of a size d1 of the portion whose extension direction is parallel to the plane where the substrate 20 is located and a size d2 of the portion whose extension direction intersects with the plane where the substrate 20 is located. The size d2 of the portion whose extension direction intersects with the plane where the substrate 20 is located mainly depends on a thickness of an insulating layer between the second B-type electrode 224 and the second A-type electrode 223. Based on the existing process, the thickness of the insulating layer between the second B-type electrode 224 and the second A-type electrode 223 may be adjusted to the order of nanos. Therefore, compared with the solution in FIG. 1, the solution in FIG. 6 may decrease the size d1 of the portion of the channel region 221c whose extension direction is parallel to the plane where the substrate 20 is located, so that finally the size d2 of the portion whose extension direction intersects with the plane where the substrate 20 is located may be comparable with the size d1 of the portion whose extension direction is parallel to the plane where the substrate 20 is located, which can reduce the length of the channel region 221c, and is even possible to reduce the length of the channel region 221c from the order of microns to the order of nanos, thereby increasing the width-to-length ratio of the channel region, improving the carrier mobility, and then improving the performance of the second thin film transistor.

Figure 7:
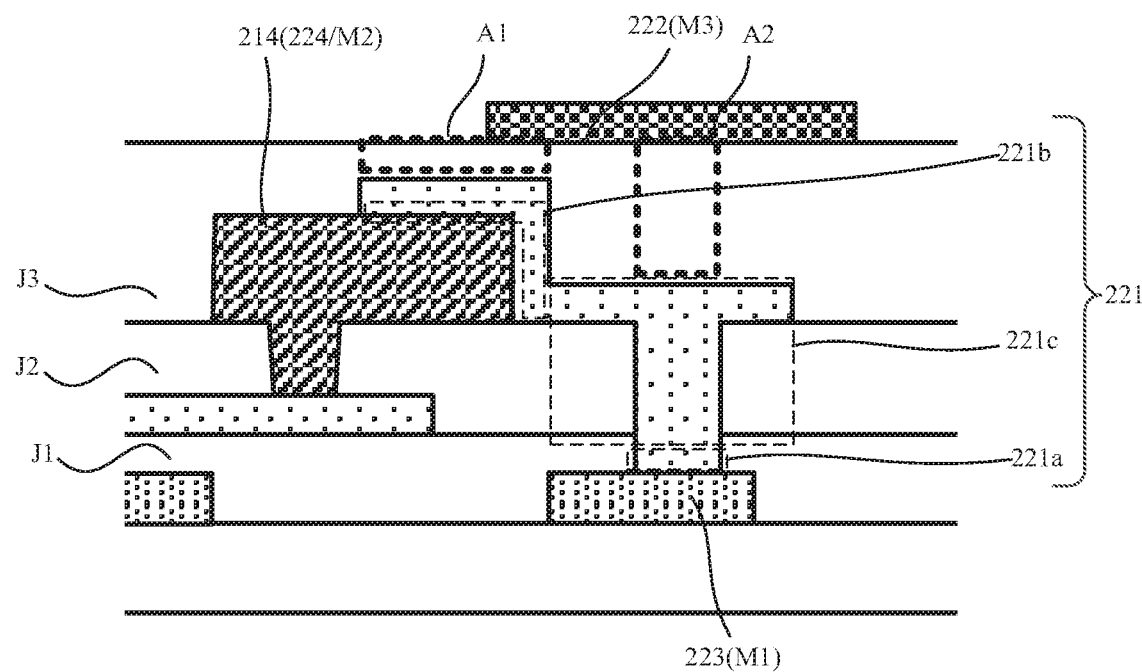
FIG. 7 is a structural diagram of a second thin film transistor in a research process of the present disclosure.

The portion of the third insulating layer J3 covering the second B-type electrode contact region 221b is defined as a portion of the third insulating layer J3, a vertical projection of which on the substrate 20 coincides with a vertical projection of the second B-type electrode contact region 221b on the substrate 20; and the portion of the third insulating layer J3 covering the second A-type electrode contact region 221a is defined as a portion of the third insulating layer J3, a vertical projection of which on the substrate 20 coincides with a vertical projection of the second A-type electrode contact region 221a on the substrate 20. FIG. 7 is a structural diagram of a second thin film transistor in a research process of the present disclosure. Referring to FIG. 7, the portion of the third insulating layer J3 covering the second B-type electrode contact region 221b is indicated by a dashed box A1, and the portion of the third insulating layer J3 covering the second A-type electrode contact region 221a is indicated by a dashed box A2. Still referring to FIG. 7, in the second thin film transistor, the portion A1 of the third insulating layer J3 covering the second B-type electrode contact region 221b and the portion A2 of the third insulating layer J3 covering the second A-type electrode contact region 221a are located on a same plane parallel to the substrate 20. Specifically, it means that in the second thin film transistor, a surface of the portion A1 of the third insulating layer J3 facing away from the substrate 20 and a surface of the portion A2 of the third insulating layer J3 facing away from the substrate 20 are located on the same plane parallel to the substrate 20. In other words, in this case, the third insulating layer J3 will completely fills trenches of each film prepared before the third insulating layer J3. After the second gate 222 is formed on the third insulating layer J3, the second gate 222 completely extends along the direction parallel to the substrate 20.

Still referring to FIG. 6, the portion of the third insulating layer J3 covering the second B-type electrode contact region 221b and the portion of the third insulating layer J3 covering the second A-type electrode contact region 221a are located on different planes parallel to the substrate 20, that is, in the second thin film transistor, the surface of the portion A1 of the third insulating layer J3 facing away from the substrate 20 and the surface of the portion A2 of the third insulating layer J3 facing away from the substrate 20 are located on different planes parallel to the substrate 20. In this way, a height difference exists between the portion of the third insulating layer J3 covering the second B-type electrode contact region 221b and the portion of the third insulating layer J3 covering the second A-type electrode contact region 221a, and under the action of the height difference, the second gate 222 will include a portion whose extension direction intersects with the plane where the substrate 20 is located. It is to be understood by those skilled in the art that in the thin film transistor, only when a distance between the channel region and the gate is less than a certain specific value, the gate has a function of controlling the channel region to be turned on or turned off; however, if the distance between the channel region and the gate is greater than or equal to the specific value, the gate loses the function of controlling the channel region to be turned on or turned off. With the solution in FIG. 7, a portion of the channel region 221c closer to the first A-type electrode region 221a is farther from the second gate 222. However, with the solution in FIG. 6, since the second gate 222 includes the portion whose extension direction intersects with the plane where the substrate 20 is located, the second gate 222 may bend along with the channel region 221c. In this way, a distance between the portion of the channel region 221c closer to the first A-type electrode contact region 221a and the second gate 222 may be reduced, in other words, the second gate 222 may be as close as possible to the portion of the channel region 221c whose extension direction intersects with the plane where the substrate 20 is located, ensuring that the second gate 222 can implement the function of controlling all positions of the channel region 221c to be turned on or turned off, and then improving reliability of the second thin film transistor.

In addition, in the above-mentioned technical solution, since the channel region 221c includes the portion whose extension direction intersects with the plane where the substrate 20 is located, and the second gate 222 includes the portion whose extension direction intersects with the plane where the substrate 20 is located, it can be seen that in a direction perpendicular to the substrate 20, compared with the first thin film transistor 21, the second thin film transistor 22 includes the second active layer 221, the second gate 222, the second A-type electrode 223 and the second B-type electrode 224 which are more concentrated, which can reduce an area of the substrate 20 occupied by the second thin film transistor 22, and then reduce a layout difficulty of circuits including the second thin film transistor 22 in the array substrate.

Based on the above-mentioned technical solution, optionally, still referring to FIG. 6, at least a portion of the channel region 221c whose extension direction is perpendicular to the plane where the substrate 20 is located, which can further reduce the length of the channel region 221c, improve the width-to-length ratio of the channel region and the carrier mobility, and then improving the performance of the second thin film transistor. In addition, this configuration can enable the second active layer 221, the second gate 222, the second A-type electrode 223 and the second B-type electrode 224 constituting the second thin film transistor 22 more concentrated, reduce the area of the substrate 20 occupied by the second thin film transistor 22, and then reduce the layout difficulty of the circuits including the second thin film transistor 22 in the array substrate.

Based on the above-mentioned technical solution, optionally, a minimum distance between the second gate 222 and the second active layer 221 is less than or equal to 1 μm. This configuration can farther ensure that the second gate 222 has the function of controlling the channel region 221c of the second active layer 221 to be turned on or turned off, and ensure effectiveness of the second thin film transistor. In addition, this configuration can ensure that other insulating layers satisfy the requirement on the thickness and can further avoid additionally manufacturing an insulating layer thinning the channel region.

In a practical configuration, optionally, still referring to FIG. 6, a thickness of the second B-type electrode 224 is greater than a thickness of the second active layer 221, so that the second A-type electrode contact region 221a and the second B-type electrode contact region 221b are located on different planes parallel to the substrate 20, and then the height difference exists between the second A-type electrode contact region 221a and the second B-type electrode contact region 221b, thereby achieving the purpose of forming the portion of the channel region 221c whose extension direction intersects with the plane where the substrate 20 is located.

Based on the above-mentioned technical solution, there are multiple methods for enabling the second A-type electrode 223 to be electrically connected to the second active layer 221. For example, the second A-type electrode 223 is electrically connected to the second active layer 221 merely through a via hole; or the second A-type electrode 223 is electrically connected to the second active layer 221 through the via hole with a step; or the second A-type electrode 223 is electrically connected to the second active layer 221 merely through the step.

Exemplarily, in FIG. 2, FIG. 4, FIG. 5 and FIG. 6, the second A-type electrode 223 is electrically connected to the second active layer 221 merely through the via hole. Specifically, an insulating layer between the second B-type electrode 224 and the second A-type electrode 223 is configured with a third via hole S3, and the second A-type electrode 223 is electrically connected to the second active layer 221 through the third via hole S3. Exemplarily; still referring to FIG. 2 and FIG. 4, the second insulating layer J2 is disposed between the second B-type electrode 224 and the second A-type electrode 223, and the third via hole S3 penetrates through the second insulating layer J2 to enable the second A-type electrode 223 to be electrically connected to the second active layer 221. In FIG. 5 and FIG. 6, the second insulating layer J2 and the first insulating layer J1 are disposed between the second B-type electrode 224 and the second A-type electrode 223, and the third via hole S3 penetrates through the second insulating layer J2 and the first insulating layer J1 to enable the second A-type electrode 223 to be electrically connected to the second active layer 221. This configuration can enable the second active layer 221 filling the third via hole S3 acts as the portion of the channel region 221c whose extension direction intersects with the plane where the substrate 20 is located, so as to reduce the length of the channel region, improve the width-to-length ratio of the channel region and the carrier mobility, and then improve the performance of the second thin film transistor.

Figure 8:
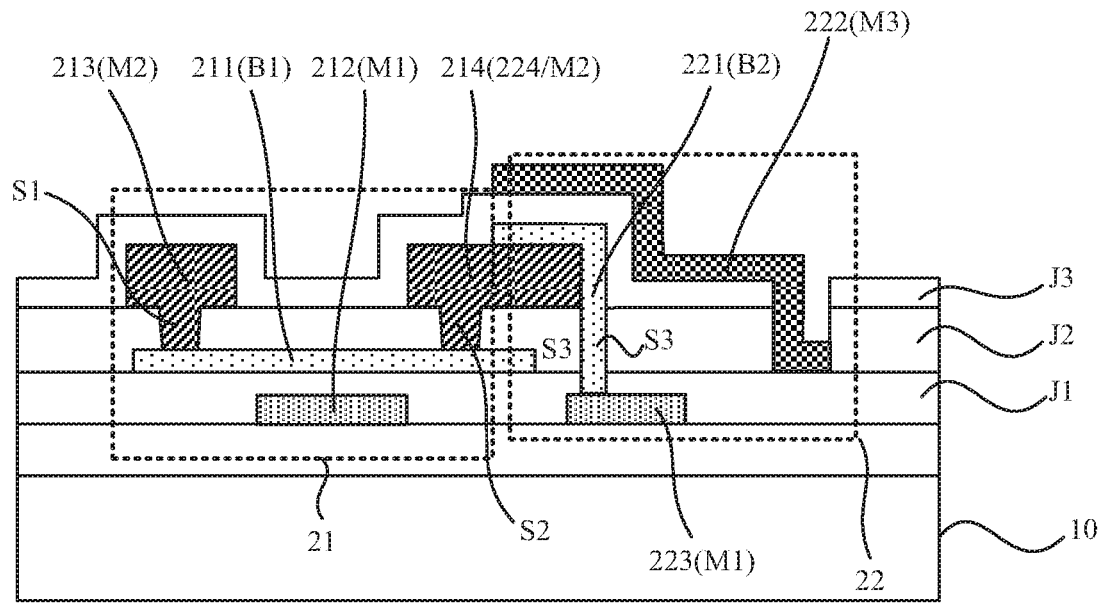
FIG. 8 is a structural diagram of another array substrate according to an embodiment of the present disclosure.
Figure 9:
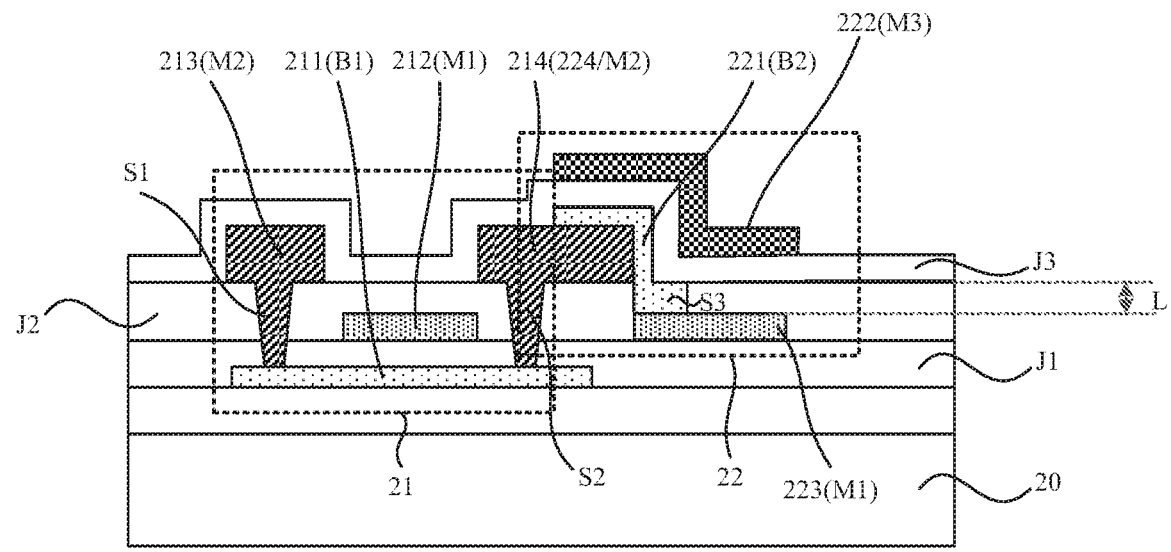
FIG. 9 is a structural diagram of another array substrate according to an embodiment of the present disclosure.
Figure 10:
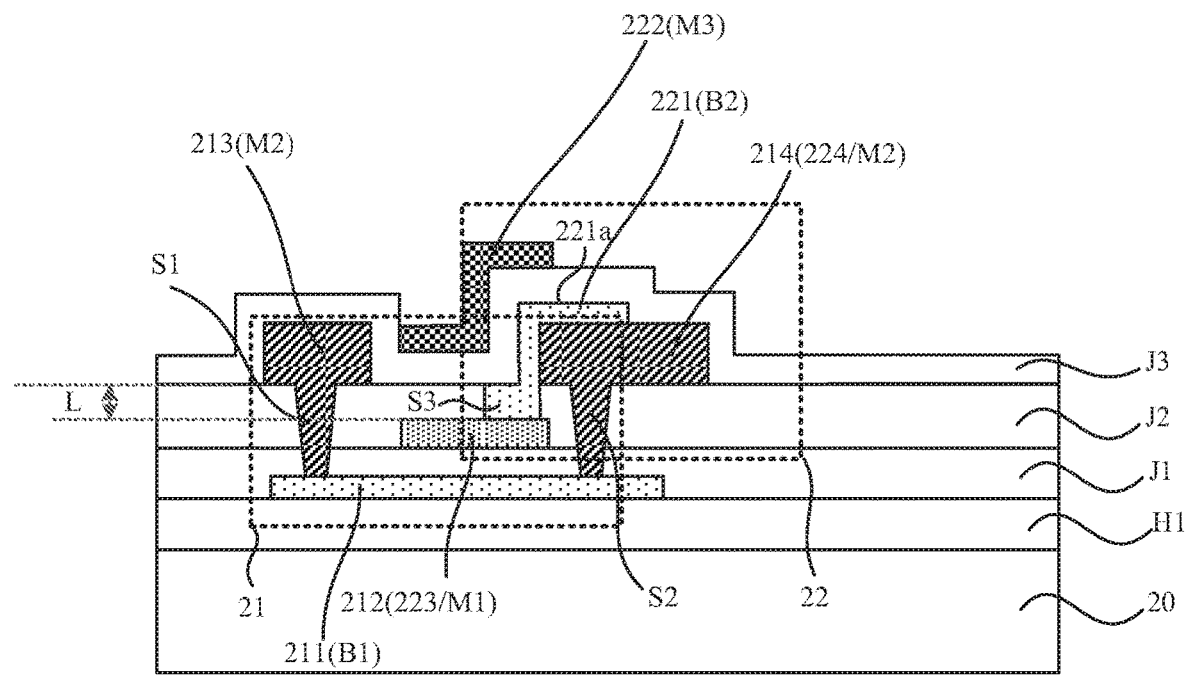
FIG. 10 is a structural diagram of another array substrate according to an embodiment of the present disclosure.

FIG. 8 is a structural diagram of another array substrate according to an embodiment of the present disclosure. FIG. 9 is a structural diagram of another array substrate according to an embodiment of the present disclosure. FIG. 10 is a structural diagram of another array substrate according to an embodiment of the present disclosure. Based on the above-mentioned technical solution, optionally; referring to FIG. 8 to FIG. 10, optionally, merely an edge of a vertical projection of the third via hole S3 on the substrate 20 is partially overlapped with an edge of a vertical projection of the second B-type electrode 224 on the substrate 20. In this way, in the second active layer 221, the channel region merely includes the portion which intersects with the plane where the substrate 20 is located and does not include the portion parallel to the plane where the substrate is located, which can further increase the width-to-length ratio of the channel region, improve the carrier mobility, and then improve the performance of the second thin film transistor 22. In this case, the length L of the channel region of the second thin film transistor is equal to a depth of the third via hole S3.

Figure 11:
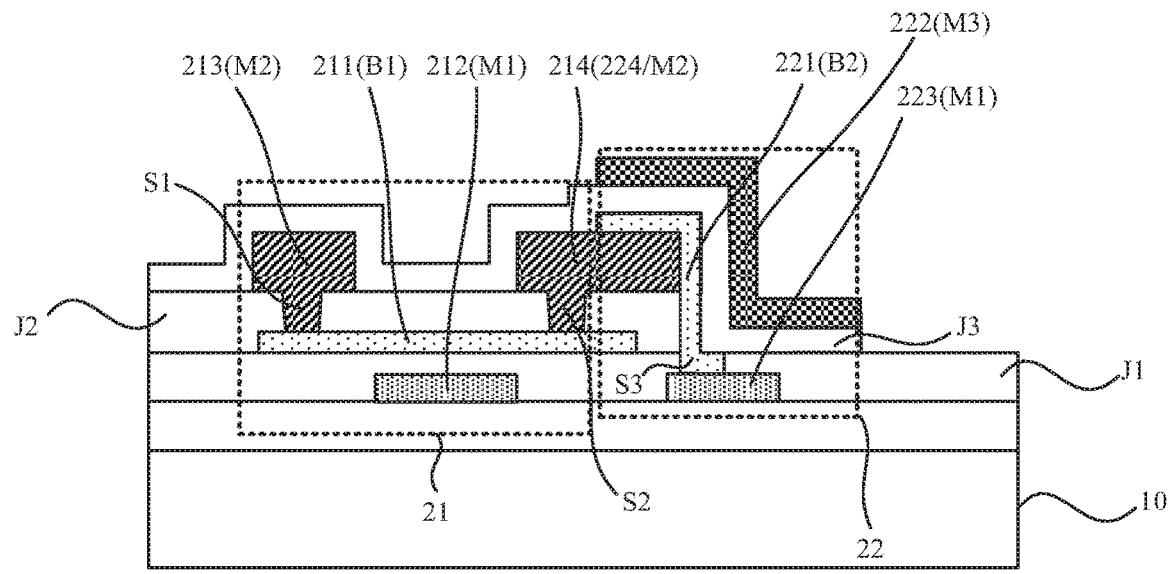
FIG. 11 is a structural diagram of another array substrate according to an embodiment of the present disclosure.
Figure 12:
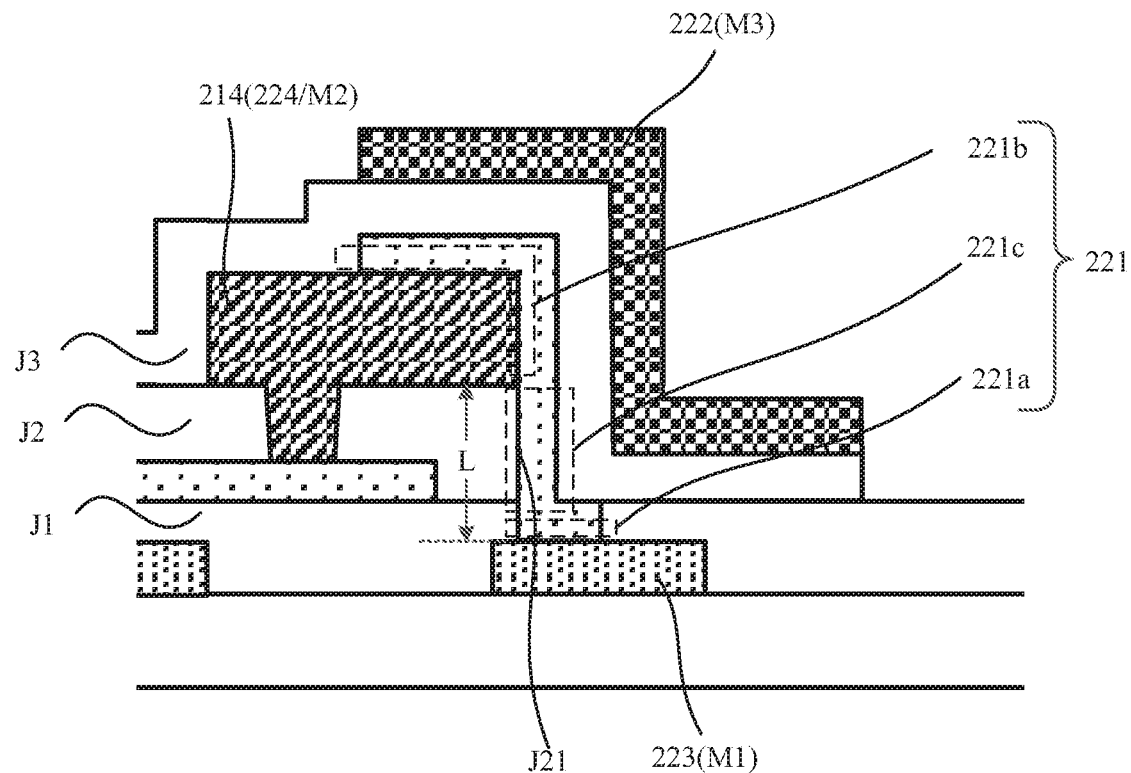
FIG. 12 is an enlarged view of a second thin film transistor shown in FIG. 11.

FIG. 11 is a structural diagram of another array substrate according to an embodiment of the present disclosure. FIG. 12 is an enlarged view of a second thin film transistor shown in FIG. 11. In FIG. 11 and FIG. 12, the second A-type electrode 223 is electrically connected to the second active layer 221 through the via hole with the step. Specifically, referring to FIG. 11 and FIG. 12, the second insulating layer J2 and the first insulating layer J1 are disposed between the second B-type electrode 224 and the second A-type electrode 223. The second insulating layer J2 includes the step, and the third via hole S3 penetrates through the first insulating layer J1. The second B-type electrode 224 is formed above the step (a direction farther away from the substrate is above), the third via hole S3 is formed below the step (a direction closer to the substrate is below), and the third via hole S3 exposes the second A-type electrode 223. The channel region 221c of the second active layer covers at least a portion of a side wall J21 of the step and fills the third via hole S3. This configuration can ensure that a sufficient height difference exists between the second A-type electrode contact region 221a and the second B-type electrode contact region 221b, so that a portion of the second active layer 221 covering the side wall J21 of the step and a portion of the second active layer 221 filling the third via hole S3 together act as the portion of the channel region 221c whose extension direction intersects with the plane where the substrate 20 is located, so as to reduce the length of the channel region 221c, improve the width-to-length ratio of the channel region 221c and the carrier mobility, and then improve the performance of the second thin film transistor.

Based on the above-mentioned technical solution, optionally, still referring to FIG. 11 and FIG. 12, the side wall of the step in the second insulating layer J2 and a side wall of the second B-type electrode 224 is flush, and merely the edge of the vertical projection of the third via hole S3 on the substrate 20 is partially overlapped with the edge of the vertical projection of the second B-type electrode 224 on the substrate 20. In this way, in the second active layer 221, the channel region 221c merely includes the portion which intersects with the plane where the substrate 20 is located and does not include the portion parallel to the plane where the substrate 20 is located, which can farther increase the width-to-length ratio of the channel region, improve the carrier mobility, and then improve the performance of the second thin film transistor. In this case, the length L of the channel region 221c of the second active layer 221 is equal to a sum of a height of the step in the second insulating layer J2 and the depth of the third via hole S3 in the first insulating layer J1.

It is to be understood that the step in the insulating layer in the present application may be understood as a step formed on an edge of a patterned insulating layer, that is, the edge of the insulating layer includes an upper surface and a lower surface of the insulating layer and side walls connecting the upper surface and the lower surface. For example, in this embodiment, an orthographic projection of at least a partial edge of the second insulating layer J2 on the substrate is cut off by an orthographic projection of the second A-type electrode 223 on the substrate or exposed on the orthographic projection of the second A-type electrode 223 on the substrate.

Figure 13:
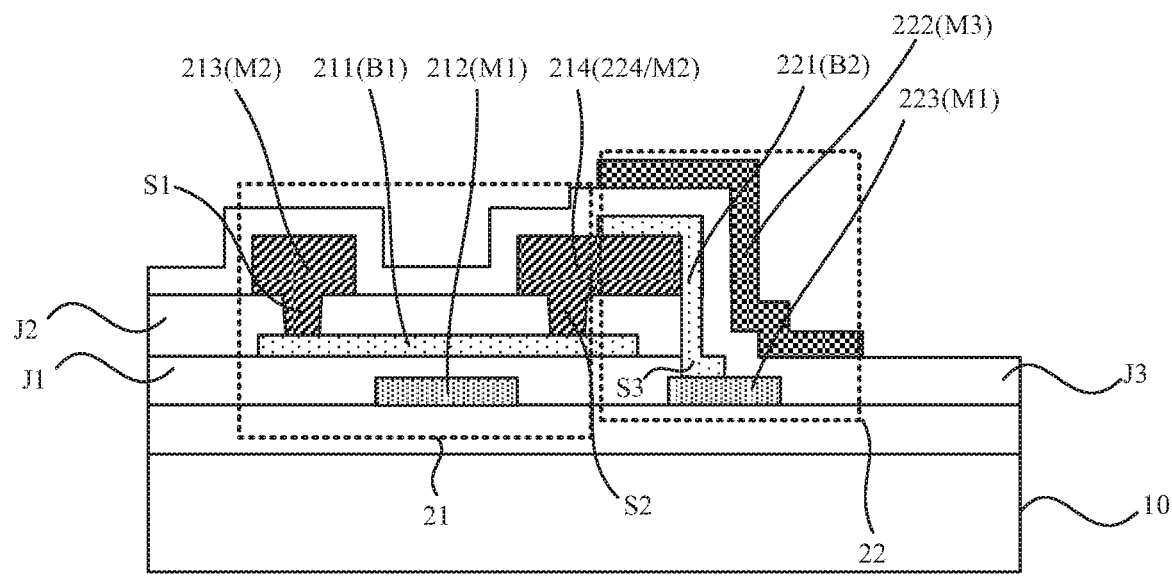
FIG. 13 is a structural diagram of another array substrate according to an embodiment of the present disclosure.
Figure 14:
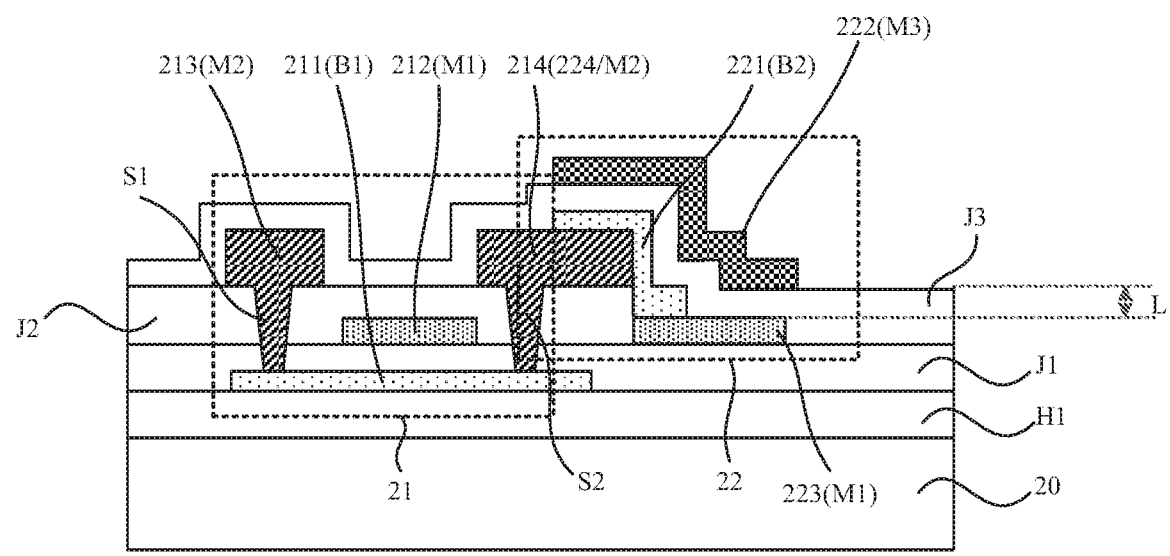
FIG. 14 is a structural diagram of another array substrate according to an embodiment of the present disclosure.

FIG. 13 is a structural diagram of another array substrate according to an embodiment of the present disclosure. FIG. 14 is a structural diagram of another array substrate according to an embodiment of the present disclosure. In FIG. 13 and FIG. 14, the second A-type electrode 223 is electrically connected to the second active layer 221 merely through the step. Specifically, in FIG. 13, the second insulating layer J2 and the first insulating layer J1 are disposed between the second B-type electrode 224 and the second A-type electrode 223. The second insulating layer J2 and the first insulating layer J1 both include the step. In FIG. 14, merely the second insulating layer J2 is disposed between the second B-type electrode 224 and the second A-type electrode 223, The second insulating layer J2 includes the step. Still referring to FIG. 13 and FIG. 14, the second B-type electrode 224 is formed above the step (the direction farther away from the substrate is above), the second A-type electrode 223 is formed below the step (the direction closer to the substrate is below), and the channel region of the second active layer 221 covers at least a portion of the side wall of the step. This configuration can ensure that the sufficient height difference exists between the first A-type electrode contact region 221a and the second B-type electrode contact region 221b, so that the portion of the second active layer 221 covering the side wall of the step acts as the portion of the channel region 221c whose extension direction intersects with the plane where the substrate 20 is located, so as to reduce the length of the channel region, improve the width-to-length ratio of the channel region and the carrier mobility, and then improve the performance of the second thin film transistor.

Furthermore, still referring to FIG. 13 and FIG. 14, if the height difference (that is, the step difference between the drain and the source of an oxide semiconductor contact region) between the first A-type electrode contact region 221a and the second B-type electrode contact region 221b is larger, a portion of an oxide semiconductor covering the side wall of the step is thinner, a portion of the third insulating layer J3 between the second active layer 221 (an oxide semiconductor layer) and the second gate 222, facing towards the portion covering the side wall of the step through the oxide semiconductor, is thinner, and the distance between the second active layer 221 (the oxide semiconductor layer) and the second gate 222 is smaller, the second active layer 221 (the oxide semiconductor layer) is more sensitive to the second gate 222, the second gate 222 is more capable of controlling the channel region of the second active layer 221 (the oxide semiconductor layer), and the second thin film transistor has better reliability.

Based on the above-mentioned technical solution, optionally, the side wall of the step and the side wall of the second B-type electrode 224 are flush. Exemplarily, in FIG. 13, a side wall of the step in the second insulating layer J2, a side wall of the step in the first insulating layer J1 and the side wall of the second B-type electrode 224 are all flush. In FIG. 14, the side wall of the step in the second insulating layer J2 and the side wall of the second B-type electrode 224 are flush. In this way, in the second active layer 221, the channel region 221c merely includes the portion which intersects with the plane where the substrate 20 is located and does not include the portion parallel to the plane where the substrate 20 is located, which can further increase the width-to-length ratio of the channel region, improve the carrier mobility, and then improve the performance of the second thin film transistor. In FIG. 13, the length L of the channel region of the second active layer 221 is equal to a sum of a height of the step in the second insulating layer J2 and a height of the step in the first insulating layer J1. In FIG. 14, the length L of the channel region of the second active layer 221 is equal to the height of the step in the second insulating layer J2.

Based on the above-mentioned technical solution, optionally, a thickness of the second insulating layer J2 between the second B-type electrode 224 and the second A-type electrode 223 is greater than or equal to 100 nm and less than or equal to 500 nm. This configuration can ensure that the second insulating layer J2 has a better insulating effect, and can further reduce the length of the channel region of the second active layer 221, thereby increasing the width-to-length ratio of the channel region, improving the carrier mobility, and then improving the performance of the second thin film transistor.

Optionally, the array substrate further includes a capacitor (not shown in the figure), where the capacitor includes a first capacitor electrode, and the first capacitor electrode is disposed in the third metal layer. In essence, this configuration enable the first capacitor electrode and the second gate to be disposed in a same module; and in the preparation process, the first capacitor electrode and the second gate may be formed in a same manufacturing process by using a same mask plate and it is unnecessary to prepare mask plates for the first capacitor electrode and the second gate separately, saving the cost, reducing the number of manufacturing processes, and improving the production efficiency.

Still referring to FIG. 14, optionally, the array substrate farther includes a buffer layer H1, where the buffer layer H1 is disposed between the substrate 20 and the first thin film transistor 21, has a function of matching the substrate 20, and may eliminate an impact of impurity particles inside or on the surface of the substrate 20 on the first thin film transistor 21 located thereon.

Figure 15:
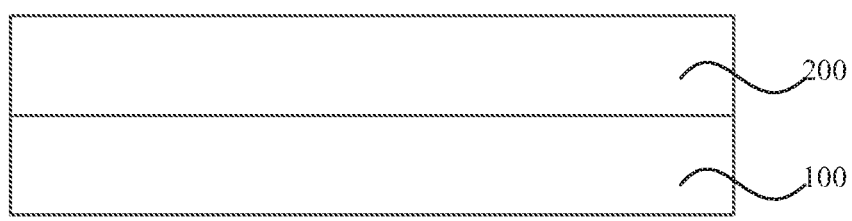
FIG. 15 is a structural diagram of a display panel according to an embodiment of the present disclosure.

Based on the same inventive concept, the present application further provides a display panel. FIG. 15 is a structural diagram of a display panel according to an embodiment of the present disclosure. Referring to FIG. 15, the display panel includes an array substrate 100 provided by the embodiments of the present disclosure. The display panel may be a liquid crystal display panel or an organic light-emitting display panel. If the display panel is the liquid crystal display panel, in FIG. 15, the display panel may farther include a color filter substrate 200 opposite the array substrate 100. If the display panel is the organic light-emitting display panel, in FIG. 15, the display panel may further include an encapsulation structure 200, where the encapsulation structure 200 may specifically be a cover plate opposite the array substrate 100 or a thin film encapsulation layer formed on the array substrate.

Since the display panel includes the array substrate according to any embodiment of the present disclosure, the display panel has same or corresponding beneficial effects as the array substrate included therein, and details are not described here again.

Figure 16:
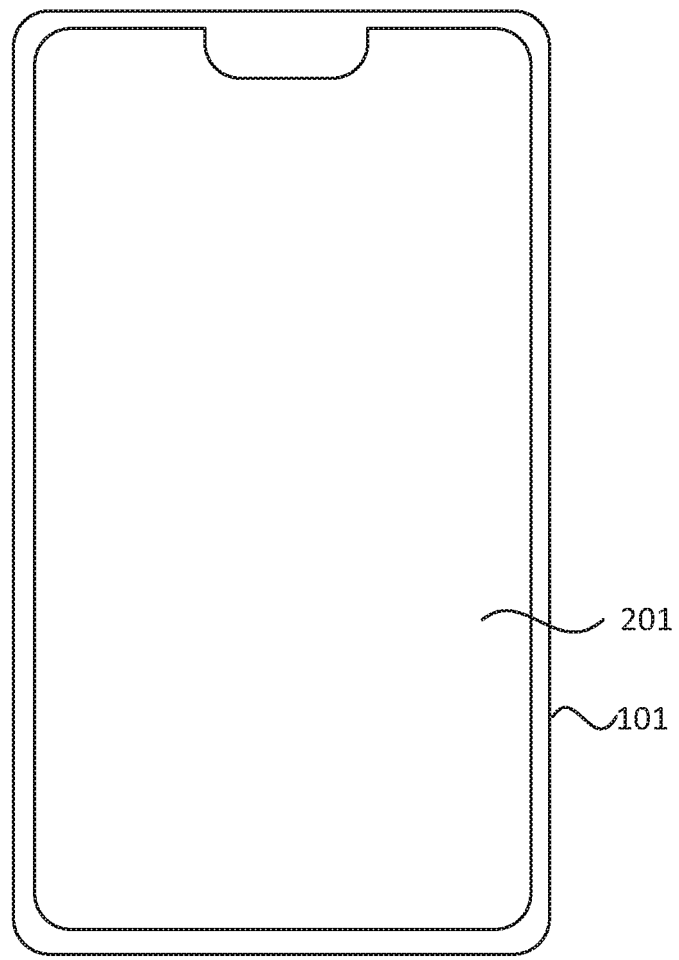
FIG. 16 is a structural diagram of a display device according to an embodiment of the present disclosure.

Based on the same inventive concept, the present application further provides a display device. FIG. 16 is a structural diagram of a display device according to an embodiment of the present disclosure. Referring to FIG. 16, a display device 101 includes a display panel 201 according to any embodiment of the present disclosure.

Since the display device includes the display panel according to any embodiment of the present disclosure, the display device has same or corresponding beneficial effects as the display panel included therein, and details are not described here again.

Figure 17:
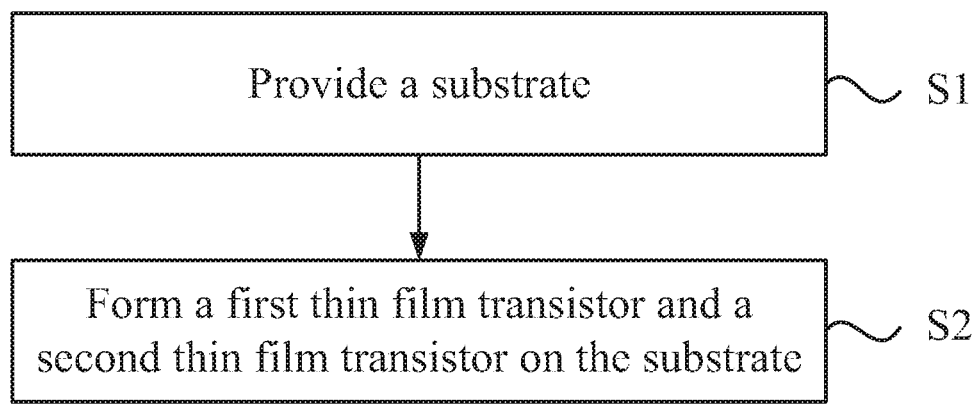
FIG. 17 is a flowchart illustrating a method for manufacturing an array substrate according to an embodiment of the present disclosure.

Based on the same inventive concept, the present application further provides a method for manufacturing an array substrate. FIG. 17 is a flowchart of a method for manufacturing an array substrate according to an embodiment of the present disclosure. Referring to FIG. 17, the method for manufacturing an array substrate includes steps described below.

In S1, a substrate is provided.

In S2, a first thin film transistor and a second thin film transistor are formed on the substrate. The first thin film transistor includes a first active layer, a first gate, a first A-type electrode and a first B-type electrode, where the first active layer includes a low temperature polysilicon active layer. The second thin film transistor includes a second active layer, a second gate, a second A-type electrode and a second B-type electrode, where the second active layer includes an oxide semiconductor active layer. In a direction perpendicular to a plane where the substrate is located, a film where the first active layer is located, a film where the first A-type electrode is located, a film where the first B-type electrode is located, and a film where the first gate electrode is located each are located between a film where the second active layer is located and the substrate. The second A-type electrode and the first gate are disposed in a same film, and the first B-type electrode is reused as the second B-type electrode. In the direction perpendicular to the plane where the substrate is located, a film where the second gate is located is disposed on a side of the film where the second active layer is located facing away from the substrate.

Since the method for manufacturing an array substrate is used for manufacturing any one of array substrates provided by the present application, the method has same or corresponding beneficial effects as the array substrate prepared by using the method.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may farther include more other equivalent embodiments without departing from the concept of the present disclosure. The scope of the present disclosure is determined by the scope of the appended claims.

What is claimed is:

1. An array substrate, comprising: a substrate, a first thin film transistor and a second thin film transistor formed on the substrate;
   wherein the first thin film transistor comprises a first active layer, a first gate, a first A-type electrode and a first B-type electrode, wherein the first active layer comprises a low temperature polysilicon active layer; and wherein the second thin film transistor comprises a second active layer, a second gate, a second A-type electrode and a second B-type electrode, wherein the second active layer comprises an oxide semiconductor active layer; wherein in a direction perpendicular to a plane where the substrate is located, a film where the first active layer is located, a film where the first A-type electrode is located, a film where the first B-type electrode is located and a film where the first gate is located are disposed between a film where the second active is located and the substrate;

the second A-type electrode and the first gate are disposed in a same film, and the first B-type electrode and the second B-type electrode are formed in a same manufacturing process by using a same mask plate; and in the direction perpendicular to the plane where the substrate is located, a film where the second gate is located is disposed on a side of the film where the second active layer is located facing away from the substrate, wherein a first semiconductor layer, a first insulating layer, a first metal layer, a second insulating layer, a second metal layer, a second semiconductor layer, a third insulating layer and a third metal layer are sequentially formed on the substrate;

wherein the first active layer is disposed in the first semiconductor layer, the first gate is disposed in the first metal layer, and the first A-type electrode and the first B-type electrode are disposed in the second metal layer;

wherein the first A-type electrode is electrically connected to the first active layer through a first via hole, and the first B-type electrode is electrically connected to the first active layer through a second via hole;

wherein the second active layer is disposed in the second semiconductor layer, the second A-type electrode is disposed in the first metal layer, and the second A-type electrode is electrically connected to the second active layer; and wherein a portion of the first B-type electrode is covered by the second active layer, and the second active layer is electrically connected to the first B-type electrode covered by the second active layer and directly contacts with the first B-type electrode covered by the second active layer, so that the first B-type electrode and the second B-type electrode are formed in the same manufacturing process by using the same mask plate; and wherein the second gate is disposed in the third metal layer, wherein one of the first A-type electrode and the first B-type electrode is a source of the first thin film transistor, and the other one of the first A-type electrode and the first B-type electrode is a drain of the first thin film transistor, and similarly, one of the second A-type electrode and the second B-type electrode is a source of the second thin film transistor, and the other one of the second A-type electrode and the second B-type electrode is a drain of the second thin film transistor.

2. The array substrate of claim 1, wherein
the second active layer comprises a contact region of the second A-type electrode, a contact region of the second B-type electrode and a channel region connecting the contact region of the second A-type electrode and the contact region of the second B-type electrode; wherein
the contact region of the second A-type electrode is electrically connected to the second A-type electrode and directly contacts with the second A-type electrode;
the contact region of the second B-type electrode is electrically connected to the second B-type electrode and directly contacts with the second B-type electrode;
a contact region of the second A-type electrode and the contact region of the second B-type electrode are located on different planes parallel to the substrate, and an extension direction of at least a portion of the channel region intersects with the plane where the substrate is located; and
wherein a portion of the third insulating layer covering the contact region of the second B-type electrode and a portion of the third insulating layer covering the contact region of the second A-type electrode are located on different planes parallel to the substrate.

3. The array substrate of claim 2, wherein
a minimum distance between the second gate and the second active layer is less than or equal to 1 μm.

4. The array substrate of claim 2, wherein
a thickness of the first B-type electrode is greater than a thickness of the second active layer.

5. The array substrate of claim 2, wherein
an insulating layer disposed between the second B-type electrode and the second A-type electrode is configured with a third via hole, and wherein the second A-type electrode is electrically connected to the second active layer through the third via hole.

6. The array substrate of claim 2, wherein
the second insulating layer comprises a step; and
the channel region of the second active layer covers at least a portion of a side wall of the step.

7. The array substrate of claim 1, wherein
a thickness of the second insulating layer between the second B-type electrode and the second A-type electrode is greater than or equal to 100 nm and less than or equal to 500 nm.

8. The array substrate of claim 1, further comprising a capacitor;
wherein the capacitor comprises a first capacitor electrode; and
the first capacitor electrode is disposed in the third metal layer.

9. A display panel, comprising the array substrate of claim 1.

10. A display device, comprising the display panel of claim 9.

11. An array substrate, comprising:
a substrate, a first thin film transistor and a second thin film transistor formed on the substrate;
wherein the first thin film transistor comprises a first active layer, a first gate, a first A-type electrode and a first B-type electrode, wherein the first active layer comprises a low temperature polysilicon active layer; and wherein the second thin film transistor comprises a second active layer, a second gate, a second A-type electrode and a second B-type electrode,
wherein the second active layer comprises an oxide semiductor active layer, wherein in a direction perpendicular to a plane where the substrate is located, a film where the first active layer is located, a film where the first A-type electrode is located, a film where the first B-type electrode is located and a film where the first gate is located are disposed between a film where the second active layer is located and the substrate;
the second A-type electrode and the first gate are disposed in a same film, and the first B-type electrode and the second B-type electrode are formed in a same manufacturing process by using a same mask plate; and
in the direction perpendicular to the plane where the substrate is located, a film where the second gate is located is disposed on a side of the film where the second active layer is located facing away from the substrate;
wherein a first metal layer, a first insulating layer, a first semiconductor layer, a second insulating layer, a second metal layer, a second semiconductor layer, a third insulating layer and a third metal layer are sequentially formed on the substrate;

wherein the first gate is disposed in the first metal layer, the first active layer is disposed in the first semiconductor layer, and the first A-type electrode and the first B-type electrode are disposed in the second metal layer;

wherein the first A-type electrode is electrically connected to the first active layer through a first via hole, and the first B-type electrode is electrically connected to the first active layer through a second via hole; and wherein the second active layer is disposed in the second semiconductor layer, the second A-type electrode is disposed in the first metal layer, and the second A-type electrode is electrically connected to the second active layer;

wherein a portion of the first B-type electrode is covered by the second active layer, and the second active layer is electrically connected to the first B-type electrode covered by the second active layer and directly contacts with the first B-type electrode covered by the second active layer, so that the first B-type electrode and the second B-type electrode are formed in the same manufacturing process by using the same mask plate; and wherein the second gate is disposed in the third metal layer, wherein one of the first A-type electrode and the first B-type electrode is a source of the first thin film transistor, and the other one of the first A-type electrode and the first B-type electrode is a drain of the first thin film transistor, and similarly, one of the second A-type electrode and the second B-type electrode is a source of the second thin film transistor, and the other one of the second A-type electrode and the second B-type electrode is a drain of the second thin film transistor.

12. The array substrate of claim 11, wherein the second active layer comprises a contact region of the second A-type electrode, a contact region of the second B-type electrode and a channel region connecting the contact region of the second A-type electrode and the contact region of the second B-type electrode; wherein the contact region of the second A-type electrode is electrically connected to the second A-type electrode and directly contacts with the second A-type electrode;

the contact region of the second B-type electrode is electrically connected to the second B-type electrode and directly contacts with the second B-type electrode;

a contact region of the second A-type electrode and the contact region of the second B-type electrode are located on different planes parallel to the substrate, and an extenstion direction of at least a portion of the channel region intersects with the plane where the substrate is located; and wherein a portion of the third insulating layer covering the contact region of the second B-type electrode and a portion of the third insulating layer covering the contact region of the second A-type electrode are located on different planes parallel to the substrate.

13. The array substrate of claim 11, wherein a thickness of the second insulating layer between the second B-type electrode and the second A-type electrode is greater than or equal to 100 nm and less than or equal to 500 nm.

14. The array substrate of claim 11, further comprising a capacitor;

wherein the capacitor comprises a first capacitor electrode; and the first capacitor electrode is disposed in the third metal layer.

15. A method for manufacturing an array substrate, comprising:

providing a substrate;

forming a first thin film transistor and a second thin film transistor on the substrate;

wherein the first thin film transistor comprises a first active layer, a first gate, a first A-type electrode and a first B-type electrode, wherein the first active layer comprises a low temperature polysilicon active layer;

wherein the second thin film transistor comprises a second active layer, a second gate, a second A-type electrode and a second B-type electrode, wherein the second active layer comprises an oxide semiconductor active layer;

wherein in a direction perpendicular to a plane where the substrate is located, a film where the first active layer is located, a film where the first A-type electrode is located, a film where the first B-type electrode is located and a film where the first gate is located are disposed between a film where the second active layer is located and the substrate, the second A-type electrode and the first gate are disposed in a same film, and the first B-type electrode and the second B-type electrode are formed in a same manufacturing process by using a same mask plate; and wherein in the direction perpendicular to the plane where the substrate is located, a film where the second gate is located is disposed on a side of the film where the second active layer is located facing away from the substrate, wherein a first semiconductor layer, a first insulating layer, a first metal layer, a second insulating layer, a second metal layer, a second semiconductor layer, a third insulating layer and a third metal layer are sequentially formed on the substrate;

wherein the first active layer is disposed in the first semiconductor layer, the first gate is disposed in the first metal layer, and the first A-type electrode and the first B-type electrode are disposed in the second metal layer;

wherein the first A-type electrode is electrically connected to the first active layer through a first via hole, and the first B-type electrode is electrically connected to the first active layer through a second via hole;

wherein the second active layer is disposed in the second semiconductor layer, the second A-type electrode is disposed in the first metal layer, and the second A-type electrode is electrically connected to the second active layer; and wherein a portion of the first B-type electrode is covered by the second active layer, and the second active layer is electrically connected to the first B-type electrode covered by the second active layer and directly contacts with the first B-type electrode covered by the second active layer, so that the first B-type electrode and the second B-type electrode are formed in the same manufacturing process by using the same mask plate; and wherein the second gate is disposed in the third metal layer, wherein one of the first A-type electrode and the first B-type electrode is a source of the first thin film transistor, and the other one of the first A-type electrode and the first B-type electrode is a drain of the first thin film transistor, and similarly, one of the second A-type electrode and the second B-type electrode is a source of the second thin film transistor, and the other one of the second A-type electrode and the second B-type electrode is a drain of the second thin film transistor.

\* \* \* \* \*